United States Patent [19]

Hatano et al.

[11] Patent Number: 5,432,808
[45] Date of Patent: Jul. 11, 1995

[54] COMPOUND SEMICONDUTOR LIGHT-EMITTING DEVICE

[75] Inventors: Ako Hatano, Tokyo; Yasuo Ohba, Yokohama, both of Japan

[73] Assignee: Kabushiki Kaisha Toshiba, Kawasaki, Japan

[21] Appl. No.: 212,787

[22] Filed: Mar. 15, 1994

[30] Foreign Application Priority Data

Mar. 15, 1993 [JP] Japan .................................. 5-080160

[51] Int. Cl.$^6$ ............................................. H01S 3/19
[52] U.S. Cl. ........................................ 372/45; 257/77; 372/44
[58] Field of Search ............... 372/43, 44, 45, 46; 257/77

[56] References Cited

U.S. PATENT DOCUMENTS

| | | | |
|---|---|---|---|
| 5,187,547 | 2/1993 | Niina et al. | 257/77 |
| 5,243,204 | 9/1993 | Suzuki et al. | 257/77 |
| 5,323,022 | 6/1994 | Glass et al. | 257/77 |

FOREIGN PATENT DOCUMENTS 5-63236  3/1993  Japan .

OTHER PUBLICATIONS

Extended Abstracts (The 40th Spring Meeting, 1993): The Japan Society of Applied Physics and Related Societies 31p-ZQ-17; T. Okahisa, et al., "Growth of GaN films on GaAs, 3cSiC . . . " (no month).
Journal of Crystal Growth, vol. 127, pp. 136-142, M. J. Paisley, et al., "Molecular Beam Epitaxy of Nitride Thin Films 1993 (no month)".
Applied Surface Science, vol. 41/42, pp. 504-508, 1989, T. Sasaki, et al., "MOVPE-Grown GaN on Polar Planes . . . " (no month).

Primary Examiner—James W. Davie
Attorney, Agent, or Firm—Oblon, Spivak, McClelland, Maier & Neustadt

[57] ABSTRACT

A compound semiconductor light-emitting device includes a cubic SiC substrate, and an $Ga_xAl_yIn_{1-x-y}N$ ($0 \leq x \leq 1$, $0 \leq y \leq 1$) layer formed on the (111) surface of the cubic-crystal SiC substrate. The surface of the $Ga_xAl_yIn_{1-x-y}N$ layer, which opposes the substrate, is an N surface, and the light-emitting device has a pn junction.

20 Claims, 7 Drawing Sheets

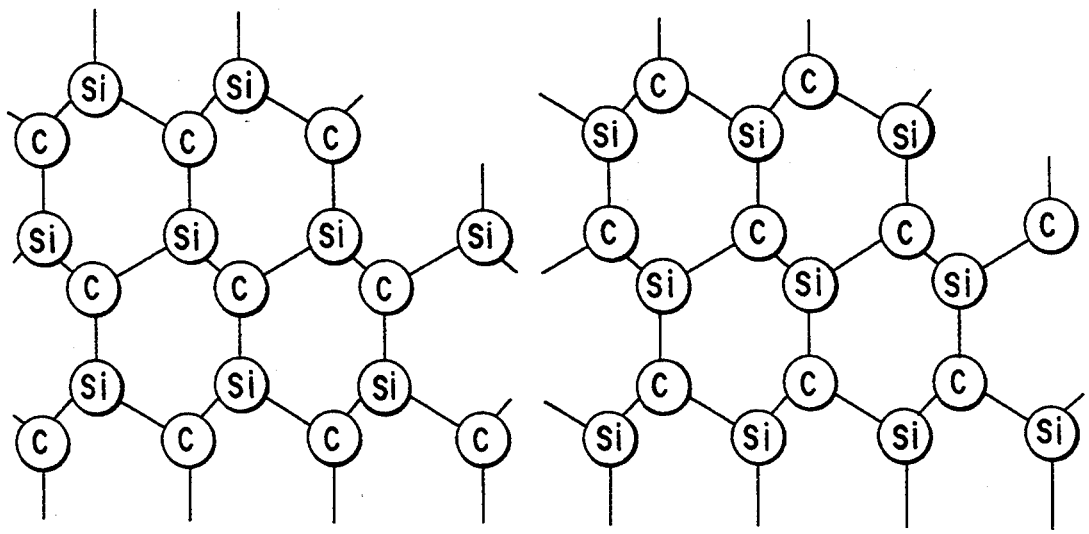
F I G. 2A      F I G. 2B
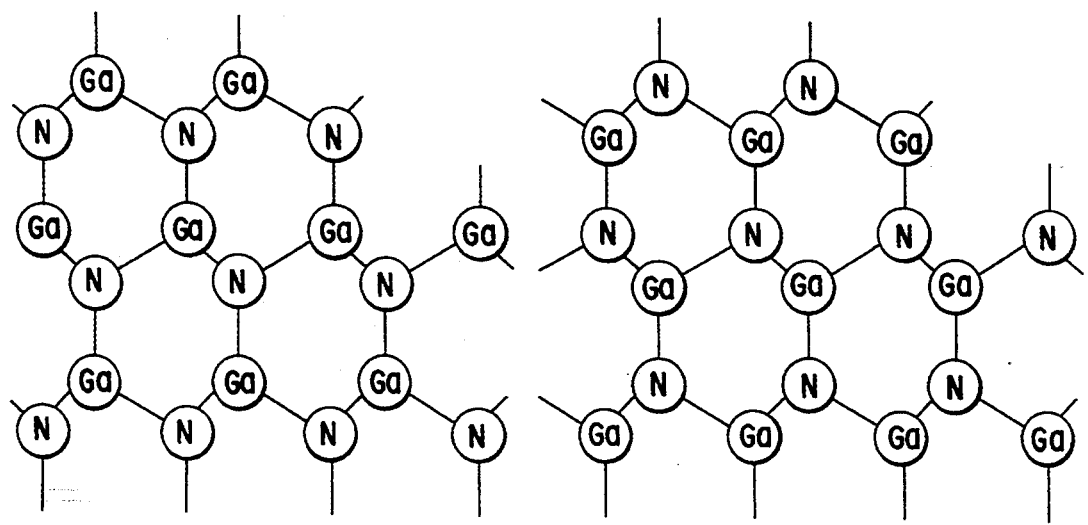
Ga surface
(with buffer)
F I G. 3A
N surface
(without buffer)
F I G. 3B

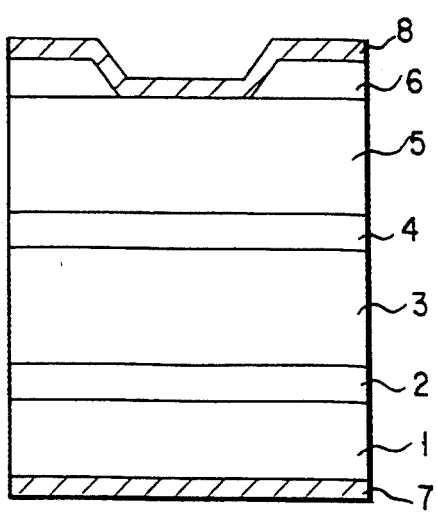
F I G. 4
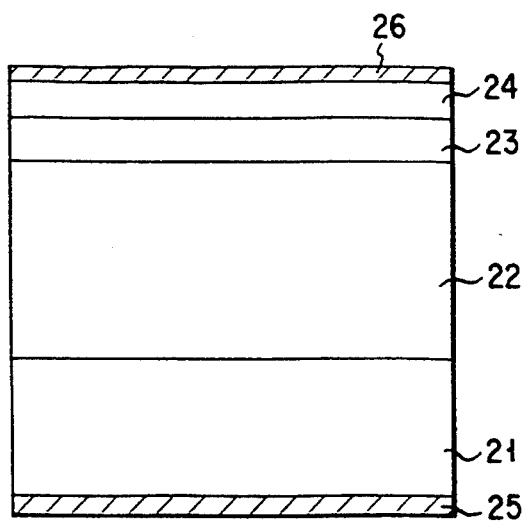
F I G. 6
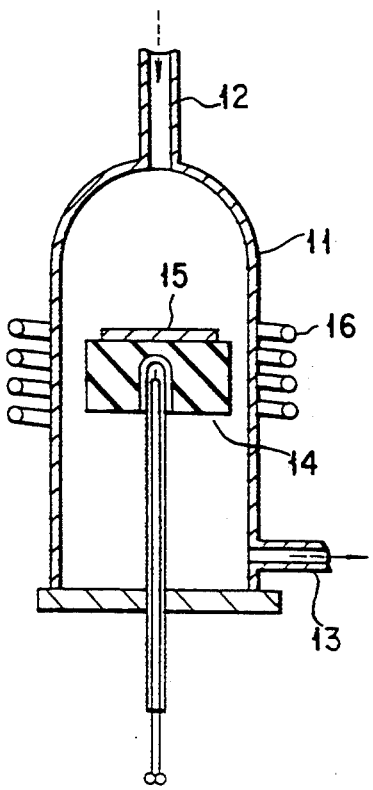
F I G. 5
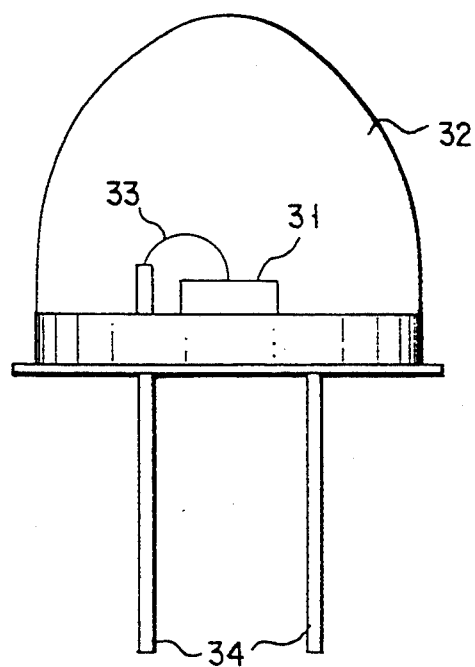
F I G. 7

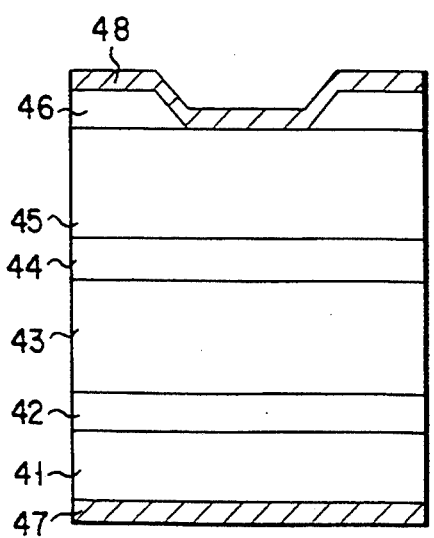
F I G. 8
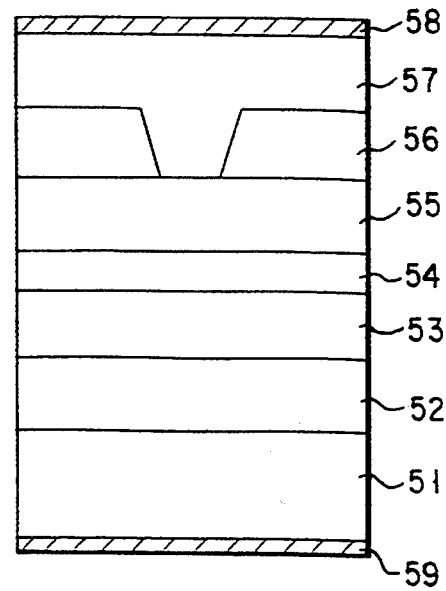
F I G. 9
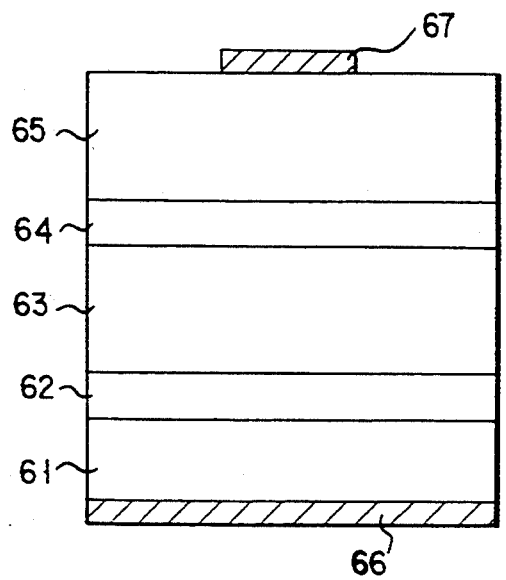
F I G. 10
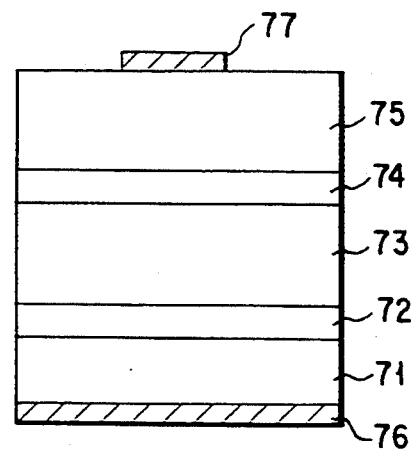
F I G. 11

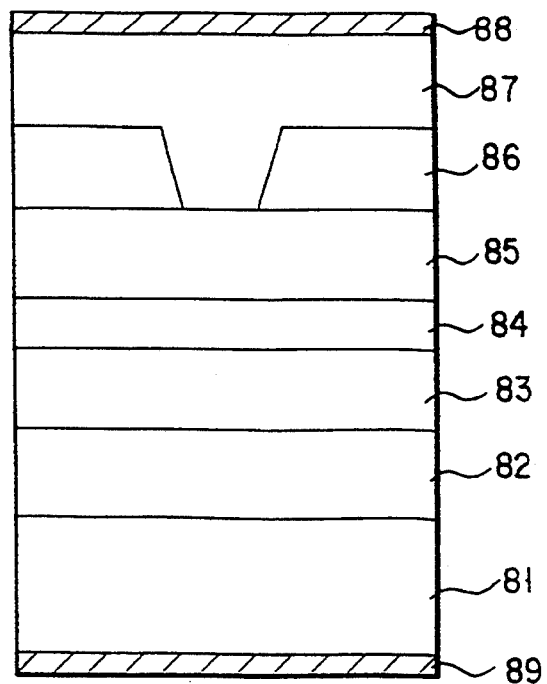
F I G. 12
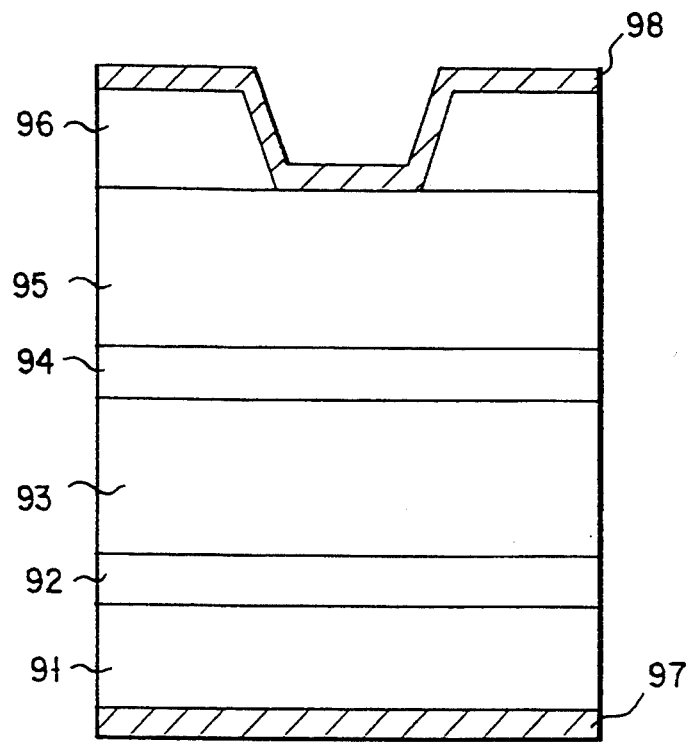
F I G. 13

COMPOUND SEMICONDUTOR LIGHT-EMITTING DEVICE

BACKGROUND OF THE INVENTION

1. Field of the Invention

The present invention relates to a compound semiconductor device.

2. Description of the Related Art

GaN as a nitrogen-containing III-V compound semiconductor has a wide bandgap of 3.4 eV and is of a direct transition type. Therefore, GaN is expected as the material of short-wavelength light-emitting devices. Since, however, GaN has a wurtzite crystal structure and a high ionicity, it readily causes lattice defects. Further, it is difficult to obtain a low-resistance p-type GaN crystal. Especially when a p-type layer is formed by using, e.g., Mg as an acceptor impurity, hydrogen diffuses into an epitaxial layer to extremely decrease the degree of activation of the acceptor, and this makes it difficult to obtain a low resistance.

That is, it has been attempted to fabricate a double-hetero laser structure using GaN as a light-emitting layer and GaAlN as a cladding layer. In this structure, the thickness of the cladding layer required to confine light in the light-emitting layer depends upon the wavelength of the light. Since the emission wavelength of GaN is short, it is assumed that the thickness of the cladding layer can be small. For this reason, devices are normally fabricated by using thin cladding layers with a thickness of about 0.2 $\mu$m.

The cladding layer, however, also plays a role of confining carriers in an active layer. According to the studies made by the present inventors, it is found that in a hetero junction constituted by nitrides such as GaAlN and GaN, the barrier height in the hetero interface is low, so the thickness of the cladding layer that is conventionally used is unsatisfactory to efficiently confine electrons and holes in the light-emitting layer. However, there is no substrate which lattice-matches with GaN. Therefore, if thick films are grown, strains caused by differences between the lattice constants and between the thermal expansion coefficients of the two substances are accumulated. The resulting increase in lattice defects makes the growth of thick films difficult.

To be more concrete, GaN is grown mostly on a sapphire substrate with a large lattice mismatch of about 15% for convenience. However, sapphire and GaN have different crystal types and a large difference in thermal expansion coefficient. For this reason, strains in the interface caused by the lattice mismatching between the substrate and GaN induce lattice defects. To reduce the influence of the lattice mismatching, therefore, various methods have been proposed.

For example, in situations where a vapor phase epitaxial (VPE) process was used as a crystal growth process, it was attempted to reduce strains in the interface with a substrate by growing a thick film about 100 $\mu$m in thickness. However., no high-quality crystal could be grown because, e.g., cracks were produced. It was also attempted to form an amorphous layer on a substrate through low-temperature growth by using a metal organic chemical vapor deposition (MOCVD) process. However, the X-ray diffraction width of GaN grown by this process was very large, indicating the presence of defects at a high density. Although thick film formation was also attempted in the MOCVD growth process, the result was an increase, rather than a decrease, in defects. That is, it was impossible to grow thick films with a thickness of 3 $\mu$m or more.

On the other hand, with regard to resistance of the p-type crystal, recently, it is reported that the resistance of GaN can be greatly decreased by irradiating it with an electron beam or heating it in an inert atmosphere. It is, however, difficult to obtain devices having good characteristics by these methods. That is, in the method of radiating an electron beam, electrons to be radiated must have a high energy in order to penetrate to a sufficient depth, and this readily induces crystal defects. In the case of the heat treatment, on the other hand, heating at 800° C. or higher is required to sufficiently decrease the resistance. At this temperature, however, vacancies are created in an epitaxial layer by removal of N atoms, leading to lattice defects.

Even if a low resistance p-type layer is obtained, a contact resistance with an electrode and a series resistance of the device are not improved. In order to improve the device performance, it is also necessary to reduce these resistances.

Though, thus, GaN is expected as material for a light-emitting device, a formation of a thick GaN series compound layer brings about lattice defects at a high density. This lattice defects limits the thickness of a cladding layer. In addition, it is difficult to form a low-resistance p-type layer. Thus, a high-quality light-emitting device is not realized yet.

SUMMARY OF THE INVENTION

It is an object of the present invention to provide a high-performance compound semiconductor device by growing high-quality $Ga_xAl_yIn_{1-x-y}N$.

According to one aspect of the present invention, these is provided a compound semiconductor device comprising:

a cubic SiC substrate; and an $Ga_xAl_yIn_{1-x-y}N(0 \leq x \leq 1, 0 \leq y \leq 1)$ layer formed on a (111) surface of said cubic SiC substrate.

According to another aspect of the present invention, there is provided a compound semiconductor device having a pn junction comprising:

a substrate; and an $Ga_xAl_yIn_{1-x-y}N(0 \leq x \leq 1, 0 \leq y \leq 1)$ layer formed on said substrate, wherein a crystal face of said $Ga_xAl_yIn_{1-x-y}N$ layer opposing said substrate is an N surface.

According to still another aspect of the present invention, there is provided a compound semiconductor device comprising:

a p-type conductive substrate;

a p-type $Ga_xAl_yIn_{1-x-y}N$ $(0 \leq x \leq 1, 0 \leq y \leq 1)$ layer formed on said substrate, and an n-type $Ga_xAl_yIn_{1-x-y}N$ $(0 \leq x \leq 1, 0 \leq y \leq 1)$ layer formed on said p-type $Ga_xAl_yIn_{1-x-y}N$ layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention.

FIGS. 2A and 2B are schematic views showing the Si surface and the C surface of an SiC substrate, respectively;

FIGS. 3A and 3B are schematic views showing the GaN layer having different face orientations and formed on a sapphire substrate;

FIG. 4 is a schematic sectional view showing a semiconductor laser according to one embodiment of the present invention;

FIG. 5 is a schematic view showing the arrangement of a deposition apparatus used in the fabrication of the semiconductor laser illustrated in FIG. 4;

FIG. 6 is a schematic sectional view showing the arrangement of an LED according to another embodiment of the present invention;

FIG. 7 is a view showing a state in which an LED chip is encapsulated in a resin case;

FIG. 8 is a schematic sectional view showing the arrangement of a semiconductor laser according to still another embodiment of the present invention;

FIG. 9 is a schematic sectional view showing the arrangement of a semiconductor laser according to still another embodiment of the present invention;

FIG. 10 is a schematic sectional view showing the arrangement of a semiconductor laser according to still another embodiment of the present invention;

FIG. 11 is a schematic sectional view showing the arrangement of a semiconductor laser according to still another embodiment of the present invention;

FIG. 12 is a schematic sectional view showing the arrangement of a semiconductor laser device according to still another embodiment of the present invention;

FIG. 13 is a schematic sectional view showing the arrangement of a semiconductor laser device according to still another embodiment of the present invention;

DETAILED DESCRIPTION OF THE PREFERRED EMBODIMENTS

In general, processes of intrusion of defects into growing layers are classified into two categories. One is a process in which defects are introduced by strains caused by the difference in lattice constant between a substrate and a growing layer during the growth. The other is a process in which defects are introduced by strains produced by the difference in thermal expansion between a substrate and a growing layer when the temperature is lowered from the growth temperature to room temperature after the growth. It is conventionally assumed that defects in a growing layer are caused primarily by lattice strains between the growing layer and a substrate, and that it is therefore very difficult to from a low-dislocation layer by growth of a GaAlInN-based material. This is so because no appropriate substrate on which the GaAlInN-based material can be grown has been found.

The present inventors, however, have made extensive studies and found that since the growth temperature of GaN is high, 1,000° C. or higher, most dislocations are eliminated by annealing at this growth temperature, so most dislocations that are actually observed are caused by strains accumulated due to a large difference in thermal expansion coefficient between GaN and a substrate during cooling. This result is conspicuous especially when a growth surface is a (0001) surface (a C surface) which is assumed to facilitate the motion of dislocations. This demonstrates that when a GaN-based compound is to be used, it is important to use a substrate having a thermal expansion coefficient, rather than a lattice constant, closer to that of the compound in order to reduce defects.

6H-SiC has the same hexagonal crystal structure as that of GaN and a lattice constant closer to that of GaN. For this reason, it has been attempted to grow a GaN layer on a 6H-SiC substrate. However, defects of the GaN layer grown on the 6H-SiC substrate were not much reduced. The reason for this can be assumed that the difference in thermal expansion coefficient between 6H-SiC and GaN is large. However, a thermal expansion coefficient difference between the two substances in a direction parallel to the (111) plane of 3C-SiC, which is also an SiC crystal but has a cubic crystal structure, is very close to a thermal expansion coefficient difference in a direction parallel to the a axis of GaN.

Figure 1:
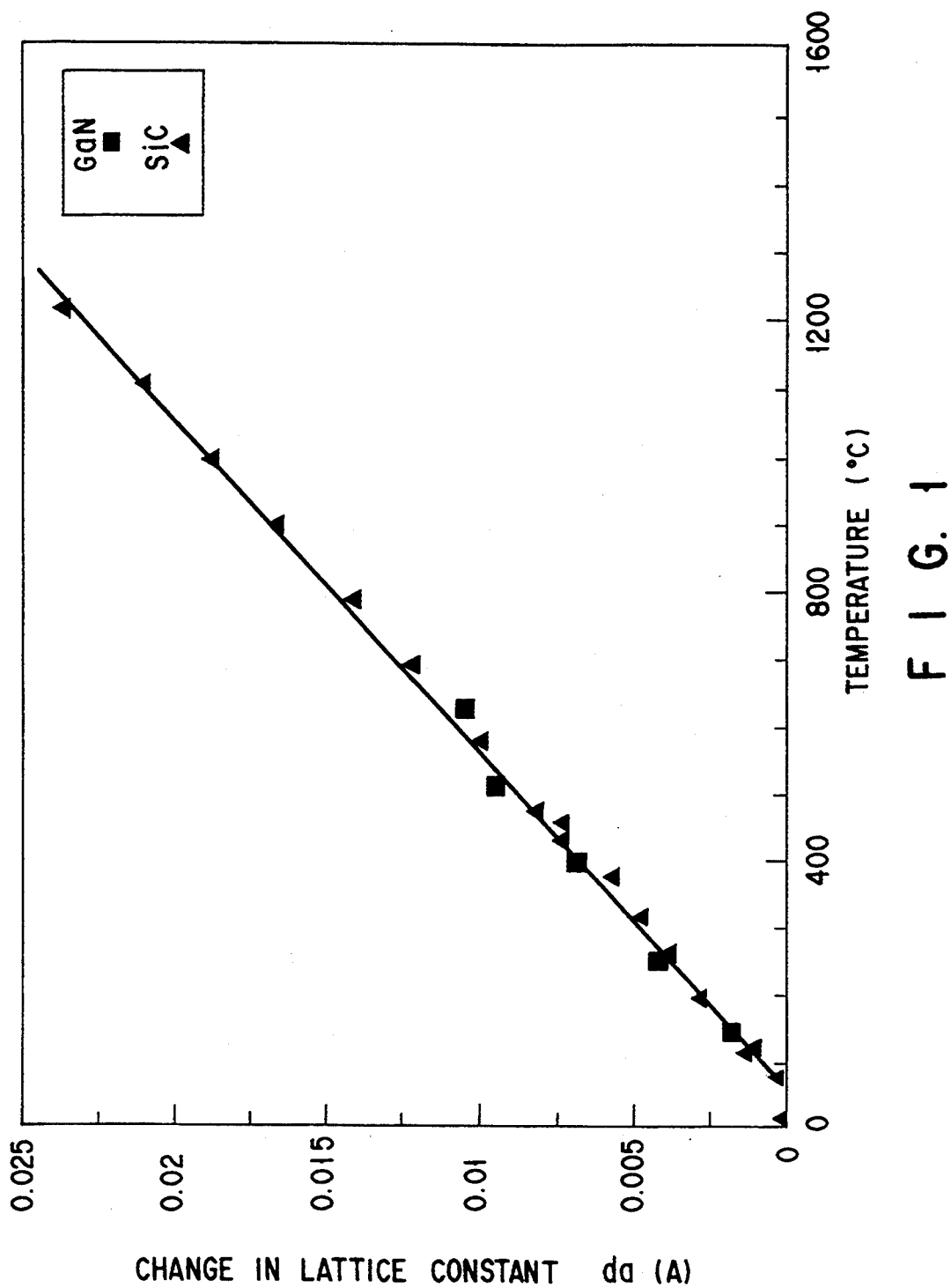
FIG. 1 is a graph showing the changes in the lattice constants of GaN and 3C-SiC with respect to the temperature.

FIG. 1 shows changes (da) in the lattice constants of GaN and 3C-SiC with respect to the temperature (T). As shown in FIG. 1, from the growth temperature to a temperature near 100° C. at which the motion of dislocations is almost negligible, a strain caused by the difference in thermal expansion coefficient between a GaN layer as an epitaxial layer and a 3C-SiC substrate is 0.001% or less. This indicates that the defect density of the epitaxial layer can be expected to be greatly decreased by the use of 3C-SiC as the substrate.

In addition, although 3C-SiC is a cubic crystal and has a large lattice constant of 0.436 nm, the spacing of (111) planes in 3C-SiC is 0.308 nm which is close to a lattice constant of 0.318 nm of GaN. Therefore, by growing GaN on the (111) plane of 3C-SiC, low-dislocation, high-quality GaN can be obtained.

Furthermore, since the strain caused by the difference in thermal expansion coefficient between a substrate and an epitaxial layer is largely decreased, it becomes possible to grow a thick film with a thickness of 3 μm or more. The growth of a thick film reduces a strain produced by the difference in lattice constant, and this permits the growth of a lower-dislocation, higher-quality layer. It is also possible to fabricate a high-performance semiconductor device using this epitaxial layer.

Where, in particular, a light-emitting device of a double hetero structure type is fabricated by using such an epitaxial layer, since cladding layers also serve to confine carriers in an active layer, as described above, and the high of the barrier in a hetero junction between layers consisting of a nitride is low, a film thickness of at least 1 μm is required to confine electrons and holes into a light-emitting layer more efficiently. When a device using of GaN is formed on a 3C-SiC substrate, it is possible to realize a thickness of a cladding layer, which is large enough to confine carriers. A mixed crystal of GaN with Al and In is also a nitride-based material similar to GaN and has almost the same thermal expansion coefficient. Therefore, a thick and high-quality layer can be grown in the same manner.

Group III-V compounds, such as GaN, AlN, and InN, have a wurtzite crystal structure, and a (1000) surface which normally a crystal growth surface has two types of orientations: an A surface whose properties are dominated by the Group III element, and a B surface whose properties are dominated by the Group V element.

The present inventors have made extensive studies and found that when GaAlInN is grown such a manner that the A surface appears on the substrate side in the growth direction, three-dimensional growth (a phenomenon in which columnar projections are formed due to the difference in growth rate on the growing surface) is readily caused, but, in contrast to this, if the B surface appears on the substrate side in the growth direction, two-dimensional growth (a phenomenon in which the growing surface becomes even) occurs, resulting in a decreased number of defects. By using this high-quality GaAlInN epitaxial layer in a semiconductor device, the performance of the device can be improved.

When the above-mentioned 3C-SiC is used as a substrate, as shown in FIGS. 2A and 2B, the Si surface and the C surface can be distinguished in SiC; and Ga of GaN corresponds to Si, and its N corresponds to C. Therefore, it is preferable to grow GaAlInN such that the N atoms on B surface opposes the Si surface of an SiC substrate, and the growing surface is A surface. For that reason, when an epitaxial layer is formed on an exposed Si surface of an SiC substrate by using a well-known vapor phase deposition process, it is possible to control the polarities such that B surface appears on the substrate side.

Further, where GaN is grown on a sapphire substrate by a metal organic chemical vapor deposition process, ammonia is used as a nitrogen source. At a high temperature of 1000° C., however, which is a growing temperature, an AlN layer is formed on the surface of the sapphire substrate, and thus the surface of the sapphire substrate becomes B surface. As a result, the growing surface of GaN becomes B surface.

Since, however, ammonia has a low decomposition degree, and so the supply of N atoms is deficient, the B surface to which N atoms are exposed is unstable, and the A surface to which the Group III element is exposed is stable. For this reason, it is difficult to perform a high-quality growth if GaN is grown directly on a sapphire substrate. Therefore, to suppress introduction of defects and obtain a good crystal growth, it is important to control the polarity of the growing surface such that the growing surface becomes A surface.

The polarity of a growing surface when a Group III-V compound, such as GaN, is to be grown on a non-polar substrate, such as sapphire, is determined in accordance with whether the Group III element or the Group V element is adsorbed first in the surface of the substrate. If the Group V element is adsorbed first, A surface becomes the growing surface; if the Group III element is adsorbed first, B surface becomes the growing surface. Therefore, to control the polarity of the growing surface to A surface, N atom, which is Group V element, need only be adsorbed first regardless of the type of Group III element. For this purpose, to effectively cause ammonia molecules or a decomposed product of the ammonia molecules serving as a supply source of nitrogen to stay on the surface, the substrate temperature must be controlled to 700° C. or lower, preferably 600° C. or lower to form a buffer layer.

A buffer layer for controlling the polarity as described above need only consist of a single crystal. The reason is as follows. To keep information of the crystal orientation of a polycrystalline or amorphous substrate which is conventionally used, the film thickness must be precisely controlled, and it is impossible to control the polarity of the crystal. However, no such limitation is imposed in a method using the single-crystal buffer. In addition, when InN, GaInN, AlInN, or GaAlInN containing In is used, a high-quality single crystal can be grown even at low temperatures of 600° C. or less, and these materials can be used more effectively. FIGS. 3A and 3B illustrate the GaN layer having different face orientation grown on the sapphire substrate. It is seen from FIGS. 3A and 3B, that, when GaN is directly grown on the substrate, the growing surface becomes B surface, on the other hand, when GaN is grown on the substrate through a buffer layer, the growing surface becomes A surface, and thus, N atoms of B surface oppose to the substrate.

As described above, in the present invention, by epitaxially growing $Ga_xAl_yIn_{1-x-y}N$ such that A surface becomes the growing surface in the direction of growth by controlling the polarity, a Group III element surface can be selectively grown, and this makes it possible to dramatically reduce dislocations and strains. This permits the growth of a low-defect $Ga_xAl_yIn_{1-x-y}In^N$ crystal, improving the performance of a semiconductor device using this crystal.

The semiconductor device having pn junction may be one having double hetero junction. Note that, in the present invention the polarity of a crystal to be grown can be determined by RBS (rutherford BackScattering).

With the compound semiconductor device according to the present invention, in order to form a p-type layer the degree of activation of a p-type dopant must be increased. To increase the activation degree, it is known that reducing mixing of hydrogen into a crystal is important. When GaN which was grown by MOCVD was analyzed by SIMS, a large amount of hydrogen was mixed. It is assumed that this hydrogen decreased the activation degree of the p-type dopant.

In many instances, an impurity is mixed in a crystal from a source material during growth. However, the present inventors have made extensive studies and found that hydrogen in GaN is not mixed in a crystal during growth but mixed primarily by diffusion from a surface during cooling after the growth. Therefore, if the mixing amount of hydrogen in a p-type layer is reduced, the activation degree of a p-type dopant rises, and this makes the formation of a low-resistance p-type layer possible.

Several methods are possible as a method by which the p-type layer is protected from being exposed to hydrogen during the cooling. It is generally known that the diffusion rate of hydrogen is low in an n-type layer. Therefore, mixing of hydrogen into a p-type layer can be prevented by growing an n-type layer as a cap layer in the final stage of growth so as to protect the p-type layer from being exposed to hydrogen during cooling. In devices using GaN-based materials, however, an n-type layer is formed first and then a p-type layer is formed. That is, growing the n-type layer as a cap layer in the final stage of growth is not performed in actually operating devices.

Mg is normally doped to obtain a p-type GaN layer. Since, however, it is very difficult to control the concentration and the concentration profile in a low-concentration region, Mg must be doped at a concentration close to the solid solution limit in the formation of a pn junction. Since such high-concentration Mg diffuses rapidly, a steep concentration profile can be obtained, but the quality of a crystal is degraded significantly. This makes it impossible to grow a high-quality n-type layer on this p-type layer.

The present inventors, however, have made extensive studies and found that it is possible to dope Mg with a high controllability by improving the doping method. That is, in cases where no excess doping is necessary, Mg does not precipitate on the surface of a crystal to roughen the surface, and this permits the growth of a high-quality layer on the crystal face. If the growth of an n-type layer on a p-type layer is possible, mixing of hydrogen into the p-type layer is reduced to raise the activation degree of a p-type dopant, so a device structure comprising a high quality n-type layer on a low-resistance p-type layer can be realized.

More concretely, Mg is doped beforehand to a buffer layer prior to growing a p-type layer, and then an Mg-doped p-GaAlInN layer is grown. Thereafter, an Si-doped n-GaAlInN layer is grown. By this method, since the p-type layer is not exposed to hydrogen in a cooling process, a low-resistance p-GaAlInN layer can be grown.

In addition, by supplying a small amount of an Mg raw material in advance, both a high controllability and a steep concentration change can be obtained even in a low-concentration region. This makes it possible to control the Mg concentration to ½ or less the maximum concentration at which the occurrence of crystal defects can be reduced. Consequently, the performance of a resulting device can be improved without degrading its reliability. Furthermore, even if a substrate is of n-type, a pn junction with a low resistance p-type layer can be formed by growing an n-type layer as the last layer and removing this n-type layer after cooling.

In addition to the methods described above, an improvement in the cooling process performed after the growth is possible as the low-resistance p-type layer formation method. The elimination of nitrogen atoms which degrades the quality of a growing layer is little at temperatures of 900° C. or lower and almost negligible at 700° C. or lower. The mixing of hydrogen atoms which raises the resistance of a p-type layer begins at temperatures of 800° C. or lower and becomes conspicuous at 700° C. or lower. Therefore, by performing cooling in a nitrogen-containing atmosphere, such as an ammonia atmosphere, from the growth temperature to a temperature of about 900° to 700° C. and then in an inert gas at lower temperatures, it is possible to prevent both the harmful elimination of nitrogen and the mixing of hydrogen.

In this method, unlike in the method of removing hydrogen by a post-treatment, there is no limit on the time period during which a growing crystal is exposed to an inert gas at a high temperature. This makes rapid cooling within a short time period possible, preventing degradation of the quality of a crystal.

As discussed above, by performing the cooling process after the growth in an atmosphere not containing hydrogen, both the elimination of nitrogen and the mixing of hydrogen during this cooling process can be prevented. This makes the growth of a low-resistance, high-quality p-GaInAlN layer possible, leading to realization of a high-luminance, short-wavelength light-emitting device.

The present inventors have extensive studies to obtain the low resistance p-type layer and reduce the contact resistance with electrodes, and found the following matter.

GaN is formed on a sapphire substrate in a conventional structure. Since the sapphire substrate is an insulating substrate, n-GaN and p-GaN layers are sequentially grown on the sapphire substrate, the n-GaN layer having a relatively low resistance is exposed, and electrodes are formed on this exposed surface of the n-GaN layer and the p-GaN layer.

As described above, however, it is difficult to form a low-resistance p-GaN layer as the uppermost layer. For this reason, the layers may be formed on the sapphire substrate in an order of the p- and n-GaN layers. The surface of the p-GaN layer may be exposed, and to electrodes may be formed on the exposed surface of the p-GaN layer and the n-GaN layer.

In a structure, however, in which a current flows in the p-GaN layer in a direction parallel to the surface, a current path in the p-GaN layer is long. Since the p-GaN layer has a higher resistance than the n-type layer, the series resistance of the device increases to fail to obtain a high-performance device. In addition, in any structure, p-GaN undesirably base high contact resistane with electrodes.

To the contrary, with the present invention, a p-type substrate is used in place of the sapphire substrate, and p-GaN and n-GaN layers are formed on the p-type substrate in the order named, thereby solving the above problems.

That is, according to this device structure, the p-type layer having the n-type layer as a cap layer has a relatively low resistance, and the electrodes are formed on the p-type conductive substrate and the n-type GaN layer. With such a device structure, the problem of the contact resistance between the p-type layer and the p-type electrode can be solved. Further, since a current flows in the p-type layer in a direction perpendicular to the surfacer the current path is short and thus the series resistance is suppressed, thereby realizing a high-brightness, short-wavelength light-emitting device.

Various embodiments of the present invention will be described below with reference to the accompanying drawings.

FIG. 4 is a schematic sectional view showing the arrangement of a semiconductor laser according to one embodiment of the present invention. This semiconductor layer is fabricated by sequentially forming a 1 $\mu$m thick GaN buffer layer 2 (undoped), a 2.1 $\mu$m thick cladding layer 3 made of p-GaAlInN (Mg-doped, $1 \times 10^{16}$ to $1 \times 10^{19}$ cm$^{-3}$ e.g., $1 \times 10^{17}$ cm$^{-3}$), a 0.1 $\mu$m thick light-emitting layer 4 made of undoped GaAlInN, and a 1 $\mu$m thick cladding layer 5 made of n-GaAlInN (undoped or Si-doped, $1 \times 10^{16}$ to $1 \times 10^{19}$ cm$^{-3}$, e.g., $1 \times 10^{17}$ cm$^{-3}$) on a 3C-SiC substrate 1. In FIG. 4 reference numeral 6 denotes an SiO$_2$ current blocking layer; and 7 and 8, metal electrodes.

In this semiconductor laser, since the last GaAlInN layer (cladding layer) 5 is of n-type, mixing of hydrogen into the p-GaAlInN layer 3 can be prevented to form a low resistance p-GaAlInN layer (cladding layer), thereby realizing a high-brightness short-wavelength light-emitting device.

In addition, since the p- and n-GaAlInN layers as cladding layers are so formed as to have a thickness of 1 μm, a current can be injected into the active layer efficiently, resulting in an increased luminous efficiency.

A crystal growth method used to fabricate the semiconductor laser illustrated in FIG. 4 will be described below. FIG. 5 is a schematic view showing a deposition apparatus used in the fabrication of the semiconductor laser shown in FIG. 4. In the deposition apparatus shown in FIG. 5, a source gas mixture is fed from a gas feed pipe 12 into a reaction tube 11. The gas in the reaction tube 11 is exhausted from a gas exhaust pipe 13. A carbon susceptor 14 is arranged in the reaction tube 11, and a sample substrate 15 is placed on this susceptor 14. The susceptor 14 is induction-heated by an RH coil 16.

First, the SiC substrate 15 having a (111) plane exposed on its surface is placed on the susceptor 14. High-quality hydrogen is fed at a flow rate of 1 l/min through the gas feed pipe 12 to replace the air in the reaction tube 11. Subsequently, the gas exhaust pipe 13 is connected to a rotary pump to evacuate the reaction tube 11, thereby reducing the internal pressure in the reaction tube 11 to 20 to 300 torr.

After the substrate temperature is set at 450° to 900° C., crystal growth is performed by feeding organometallic Al, Ga, and In compounds together with NH$_3$ gas as an N source. Usable examples of the organometallic Al, Ga, and In compounds are Al(CH$_3$)$_3$ and Al(C$_2$H$_5$)$_3$, Ga(CH$_3$)$_3$ and Ga(C$_2$H$_5$)$_3$, and In(CH$_3$)$_3$ and In(C$_2$H$_5$)$_3$, respectively. Examples of the N source other than the NH$_3$ gas are N$_2$H$_4$, (CH$_3$)2NH$_3$, (CH$_3$)$_2$NH$_2$, and C$_2$H$_5$N$_3$.

If doping is to be performed, raw materials for dopants are also fed at the same time.

Usable examples of the raw material for dopants of n-type are an Si hydride such as SiH$_4$, an organometallic Si compound such as Si(CH$_3$)$_4$, an Se hydride such as H2Se, and an organometallic Se compound such as Se(CH$_3$)$_2$. Usable examples of the raw material for dopants of p-type are an organometallic Mg compound such as Cp$_2$Mg (cyclopentadienylmagnesium), MCp$_2$Mg (methylcyclopentadienylmagnesium), and i-PrCp$_3$Mg (isopropyl cyclopentadienylmagnesium), and an organometallic Zn compound such as Zn(CH$_3$)$_2$.

More specifically, in the fabrication of the semiconductor layer shown in FIG. 4, growth was performed by feeding, as raw materials, NH$_3$, Ga(C$_2$H$_5$)$_3$, In(CH$_3$)$_3$, and Al(CH$_3$)$_3$ at flow rates of $1 \times 10^{-3}$ mol/min, $1 \times 10^{-5}$ mol/min, $1 \times 10^{-6}$ mol/min, and $1 \times 10^{-6}$ mol/min, respectively. The substrate temperature was 700° C., the pressure was 75 torr, and the total flow rate of the source gases was 1 l/min. Si was used as the n-type dopant, and Mg was used as the p-type dopant. Si and Mg were doped by mixing silane (SiH$_4$) and cyclopentadienylmagnesium (Cp$_2$Mg), respectively, into the source gases.

The semiconductor laser wafer obtained as described above was cleaved to form a laser device with a cavity length wavelength of 300 μm. Consequently, a blue laser oscillation was observed in a pulse operation with a pulse width of 100 μsec at the liquid nitrogen temperature.

Although GaN is used as the buffer layer in this embodiment, p-GaAlN or p-GaAlInN can also be grown.

FIG. 6 is a schematic sectional view showing the arrangement of an LED according to another embodiment of the present invention. A p-GaN buffer layer (10 μm) 22, a p-GaInAlN layer (2 μm) 23, and an n-GaInAlN (2 μm) 24 are formed in sequence on a 3C-SiC substrate 21. In FIG. 6, reference numerals 25 and 26 denote metal electrodes.

The LED illustrated in FIG. 6 can be fabricated in the same fashion as in the fabrication of the semiconductor laser shown in FIG. 4 by using the deposition apparatus shown in FIG. 5.

FIG. 7 shows a state in which an LED chip 31 according to this embodiment is buried in a resin case 32 also serving as a lens. In FIG. 7, reference numeral 33 denotes an inner lead; and 34, an outer lead. The LED buried in the resin case illustrated in FIG. 7 was found to cause a blue light emission of about 5 mcd.

FIG. 8 is a schematic sectional view showing the arrangement of a semiconductor laser according to still another embodiment of the present invention. A 1 μm thick GaN buffer layer (undoped) 42 is formed on a 3C-SiC substrate 41. A 1 μm thick cladding layer 43 made of n-GaAlInN (undoped or Si-doped, $1 \times 10^{16}$ to $1 \times 10^{19}$ cm$^{-3}$, e.g., $1 \times 10^{17}$ cm$^{-3}$) is formed on the layer 42. A 0.1 μm thick light-emitting layer 44 made of undoped GaAlInN is formed on the layer 43, and a 1 μm thick cladding layer 45 made of p-GaAlInN (Mg-doped, $1 \times 10^{16}$ to $1 \times 10^{19}$ cm$^{-3}$, e.g., $1 \times 10^{17}$ cm$^{-3}$) is formed on the layer 44. In FIG. 8, reference numeral 46 denotes a current blocking layer made of SiO$_2$; and 47 and 48, metal electrodes.

Since the p- and n-GaAlInN layers as cladding layers are so formed as to have a thickness of 1 μm, a current can be injected into the light-emitting layer efficiently, resulting in an increased luminous efficiency.

In this semiconductor laser, it is possible to form an n-GaAlInN layer on the p-GaAlInN layer 45, remove this n-type layer after cooling, and thereby to prevent mixing of hydrogen into the p-GaaIInN layer 45. Thus, a high-brightness, short-wavelength semiconductor laser can be realized.

FIG. 9 is a schematic sectional view showing the arrangement of a semiconductor laser according to still another embodiment of the present invention. A 1 μm thick GaN buffer layer (undoped) 52 is formed on a 3C-SiC substrate 51 having a (111) plane exposed on its surface. A 1 μm thick cladding layer 53 made of p-GaAlInN (Mg-doped, $1 \times 10^{16}$ to $1 \times 10^{19}$ cm$^{-3}$, e.g., $1 \times 10^{17}$ cm$^{-3}$) is formed on the layer 52, and a 0.1 μm thick light-emitting layer 54 made of undoped GaAlInN is formed on the layer 53. A 1 μm thick cladding layer 55 made of n-GaAlInN (undoped or Si-doped, $1 \times 10^{16}$ to $1 \times 10^{19}$ cm$^{-3}$, e.g., $1 \times 10^{17}$ cm$^{-3}$) is formed on the layer 54. On this layer 55, a p-GaAlInN current blocking layer 56 and an n-GaAlInN cap layer 57 are formed in this order. In FIG. 9, reference numerals 58 and 59 denote metal electrodes.

In the semiconductor laser according to this embodiment, since the p- and n-GaAlInN layers as cladding layers are so formed as to have a thickness of 1 fm, a current can be injected into the light-emitting layer efficiently, resulting in an increased luminous efficiency.

A method of growing the semiconductor laser according to this embodiment by using the deposition apparatus shown in FIG. 5 will be described below.

First, the 3C-SiC substrate 51 having a (111) plane exposed on its surface is placed on the susceptor 14. High-purity hydrogen is fed at a flow rate of 1 l/min through the gas feed pipe 12 to replace the air in the reaction tube 11. Subsequently, the gas exhaust pipe 13 is connected to the rotary pump to evacuate the reaction tube 11, reducing the internal pressure to 20 to 300 torr.

After the substrate temperature is lowered to 450° to 900° C., growth is performed by switching $H_2$ gas to any of $NH_3$ gas, $N_2H_4$ gas, and an organic compound containing N, such as $(CH_3)_2N_2H_2$, and feeding an organic Ga compound, such as $Ga(CH_3)_3$ or $Ga(C_2H_5)_3$. Simultaneously, supply of Al and In is performed by feeding an organic Al compound, such as $Al(CH_3)_3$ or $Al(C_2H_5)_3$, and an organic In compound, such as $In(CH_3)_3$ or $In(C_2H_5)_3$.

If doping is to be performed, raw materials for dopants are also fed at the same time. Usable examples of the raw material for dopants of n-type are an Si hydride such as $SiH_4$ and an organic Si compound such as $Si(CH_3)_4$. Usable examples of the raw material for dopants of p-type are an organic Mg compound such as $(C_5H_5)_2Mg$ and $(C_6H_7)_2Mg$ and an organic Zn compound such as $Zn(CH_3)_2$.

More specifically, in the fabrication of the semiconductor laser illustrated in FIG. 9, the growth was performed by feeding, raw as materials, $NH_3$, $Ga(CH_3)_3$, $Al(CH_3)_3$, and $In(CH_3)_3$ at flow rates of $1\times10^{-3}$ mol/min, $1\times10^{-5}$ mol/min, $1\times10^{-6}$ mol/min, and $1\times10^{-6}$ mol/min, respectively. The substrate temperature was 1,000° C., the pressure was 76 torr, and the total flow rate of the source gases was 1 l/min. Si was used as the n-type dopant, and Mg was used as the p-type dopant. $Si(CH_3)_4$ and $Cp_2Mg$ were used as the raw materials for dopants.

To suppress mixing of hydrogen during cooling, the cooling was performed in ammonia to a temperature 800° to 850° C. and then in argon.

FIG. 10 is a schematic sectional view showing the arrangement of a semiconductor laser according to still another embodiment of the present invention. A 1 μm thick GaN buffer layer (undoped) 62 is formed on a 3C-SiC substrate 61. A 1 μm thick cladding layer 63 made of n-GaAlInN (undoped or Si-doped, $1\times10^{16}$ to $1\times10^{19}$ cm$^{-3}$, e.g., $1\times10^{17}$ cm$^{-3}$) is formed on the layer 62. A 0.1 μm thick light-emitting layer 64 made of undoped GaAlInN is formed on the layer 63, and a 1 μm thick cladding layer 65 made of p-GaAlInN (Mg-doped, $1\times10^{16}$ to $1\times10^{19}$ cm$^{-3}$, e.g., $1\times10^{17}$ cm$^{-3}$) is formed on the layer 64. In FIG. 10, reference numerals 66 and 67 denote metal electrodes.

In the semiconductor laser according to this embodiment, since the p- and n-GaAlInN layers as cladding layers are so formed as to have a thickness of 1 μm, a current can be injected into the active layer efficiently, resulting in an increased luminous efficiency.

FIG. 11 is a schematic sectional view showing the arrangement of semiconductor laser according to still another embodiment of the present invention. A 1 μm thick GaN buffer layer (updoped) 72 is formed on a 3C-SiC substrate 71 having a (111) plane exposed on its surface. A 1 μm thick cladding layer 73 p-AlGaInN (Mg-doped, $1\times10^{16}$ to $1\times10^{19}$ cm$^{-3}$, e.g., $1\times10^{17}$ cm$^{-3}$) is formed on the layer 22, and a 0.1 μm thick light-emitting layer 74 made of undoped GaAlInN is formed on the layer 73., On this layer 74, a 1 μm thick cladding layer 75 made of n-GaAlInN (undoped or Si-doped, $1\times10^{16}$ to $1\times10^{19}$ cm$^{-3}$, e.g., $1\times10^{17}$ cm$^{-3}$) is formed. In FIG. 11, reference numerals 76 and 77 denote metal electrodes.

In this semiconductor laser, since the last GaAlInN layer is of n-type, since mixing of hydrogen into the p-GaAlInN layer can be prevented, it is possible to form the low resistance p-GaAlInN layer. As a result, high-brightness, short wavelength semiconductor laser can be realized.

Since the p- and n-GaAlInN layers as cladding layers are so formed as to have a thickness of 1 μm, a current can be injected into the light-emitting layer efficiently, resulting in an increased luminous efficiency.

FIG. 12 is a schematic sectional view showing the arrangement of a semiconductor laser device according to still another embodiment of the present invention. A 1 μm thick n-GaInAlN buffer layer 82, a 1.5 μm thick n-GaInAlN cladding layer 83, a 0.1 μm thick undoped GaAlInN light-emitting layer 84, and a 1.5 μm thick p-GaAlInN cladding layer 85 are formed on a 3C-SiC substrate 81 having a (111) Si plane exposed on its surface. On the layer 85, an n-GaInAlN current blocking layer 86 and a p-GaInAlN contact layer 87 are formed in this order. In FIG. 12, reference numerals 88 and 89 denote metal electrodes.

In the semiconductor laser according to this embodiment, since the n-GaAlInN layer is formed on a (111 ) plane of the 3C-SiC substrate, it is possible to grow a high-quality GaAlInN buffer layer of a low dislocatin. Further, since the p- and n-GaAlInN layers as cladding layers are so formed as to have a thickness of 1.5 μm, a current can be injected into the active layer efficiently, resulting in an increased luminous efficiency.

When the resultant wafer was evaluated, by means of x-ray diffraction it was found that crystal defects were reduced dramatically. Therefore, a high-luminance, short-wavelength light-emitting device can be expected to be realized.

FIG. 13 is a schematic sectional view showing the arrangement of a semiconductor laser device according to still another embodiment of the present invention. A 1 μm thick GaN buffer layer (undoped) 92 is formed on a 6H-SiC substrate 91, and a 1 μm thick cladding layer 93 made of n-GaAlInN (Si-doped) is formed on the layer 92. On the layer 93, a 0.1 μm thick light-emitting layer 94 made of undoped GaAlInN and a 1 pm thick cladding layer 95 made of p-GaAlInN (Mg-doped) are formed in this order. In FIG. 13, reference numeral 96 denotes a current blocking layer made of n-GaAlInN; and 97 and 98, metal electrodes.

In this semiconductor laser device, the n-type current blocking layer is formed on the p-type cladding layer to prevent mixing of hydrogen into the p-type cladding layer.

Figure 14:
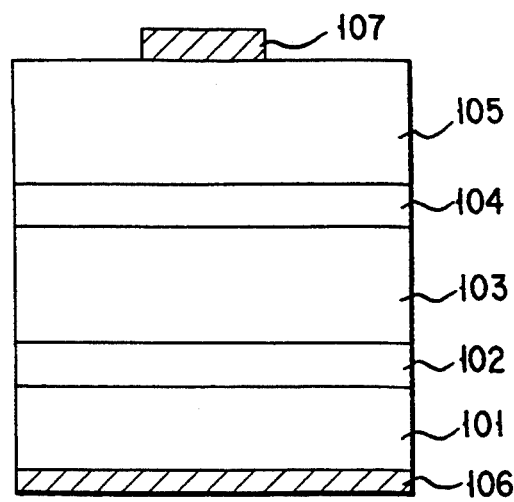
FIG. 14 is a schematic sectional view showing the arrangement of a semiconductor laser device according to still another embodiment of the present invention.

FIG. 14 is a schematic sectional view showing the arrangement of a semiconductor laser according to still another embodiment of the present invention. In this embodiment, a 6H-SiC substrate having an Si growth surface is used to make the polarities of epitaxial layers equal to each other. That is, a 1 μm thick GaN buffer layer (undoped) 102 is formed on a 6H-SiC substrate 101 having an Si plane exposed on its surface. A 1 μm thick cladding layer 103 made of n-GaAlInN (undoped or Si-doped, $1\times10^{16}$ to $1\times10^{19}$ cm$^{-3}$, e.g., $1\times10^{17}$ cm$^{-3}$) is formed on the layer 102. A 0.1 μm thick light-emitting layer 104 made of undoped GaAlInN is formed on the layer 103, and a 1 μm thick cladding layer 105 made of p-GaAlInN (Mg-doped, $1\times10^{16}$ to $1\times10^{19}$ cm$^{-3}$, e.g., $1\times10^{17}$ cm$^{-3}$) is formed on the layer 104. In FIG. 14, reference numerals 106 and 107 denote metal electrodes.

In the semiconductor laser according to this embodiment, since the p- and n-GaAlInN layers as cladding layers are so formed as to have a thickness of 1 μm, a current can be injected into the light-emitting layer efficiently, resulting in an increased luminous efficiency.

Figure 15:
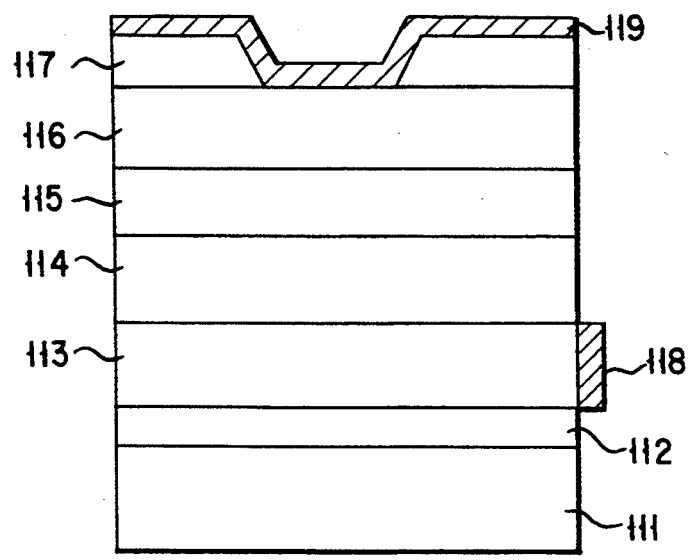
FIG. 15 is a schematic sectional view showing the arrangement of a semiconductor laser according to still another embodiment of the present invention.
Figure 16:
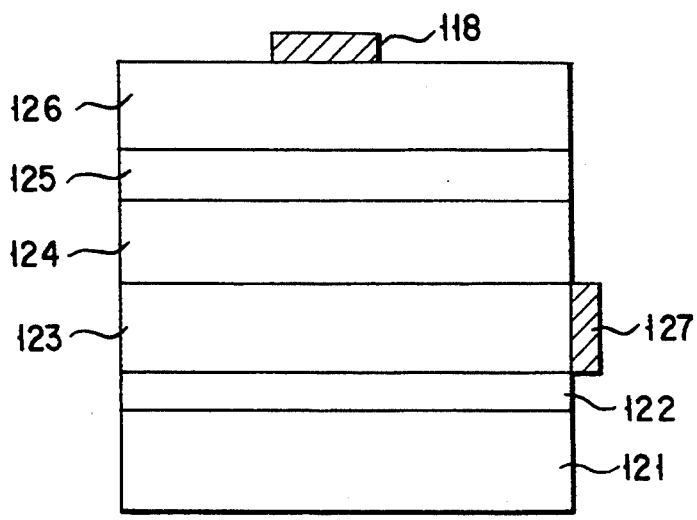
FIG. 16 is a schematic sectional view showing the arrangement of a semiconductor laser device according to still another embodiment of the present invention.
Figure 17:
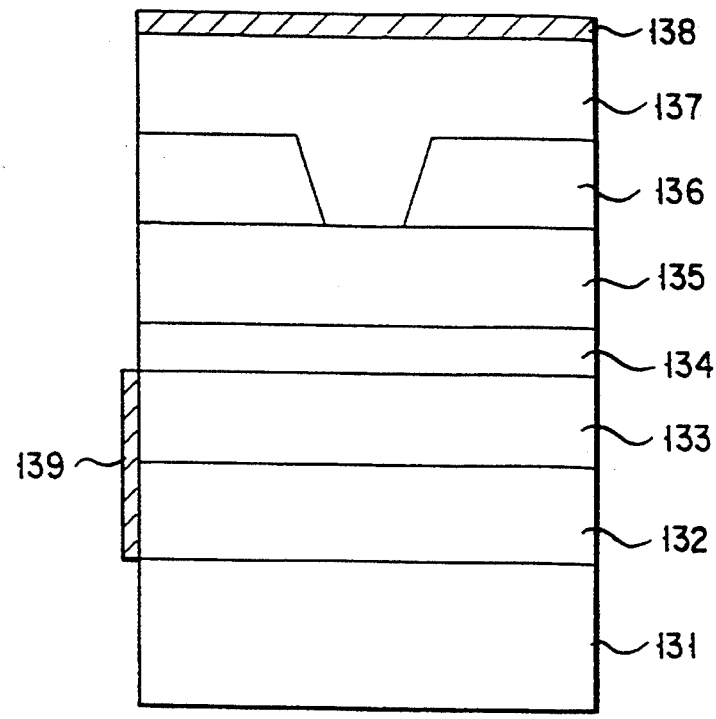
FIG. 17 is a schematic sectional view showing the arrangement of a semiconductor laser device according to still another embodiment of the present invention.

In this embodiment, the polarities of the epitaxial layers are controlled by using the 6H-SiC substrate. However, another substrate such as a sapphire substrate is also usable. FIGS. 15, 16, and 17 illustrate embodiments using a sapphire substrate. In these embodiments, the poralities of the crystals were ascertained by RBS.

FIG. 15 is a schematic sectional view showing the arrangement of a semiconductor laser according to one embodiment using a sapphire substrate. This semiconductor laser is fabricated by forming an AlN buffer layer 112 on a sapphire substrate 111 at a growth temperature of 650° C., and then sequentially forming a contact layer 113 made of p-GaAlInN, a cladding layer 114 made of p-GaAlInN, a light-emitting layer 115 made of GaAlInN, and a cladding layer 116 made of n-GaAlInN on the AlN buffer layer 112. In FIG. 15, reference numeral 117 denotes a current blocking layer consisting of SiO$_2$; and 118 and 119, metal electrodes.

In this semiconductor laser device, the n-type cladding layer 116 is formed above the p-type cladding layer to prevent mixing of hydrogen into the p-type cladding layer 114.

FIG. 16 is a schematic sectional view showing the arrangement of a semiconductor device according to another embodiment using a sapphire substrate. This semiconductor laser is fabricated by forming an AlN buffer layer 122 on a sapphire substrate 121 at a growth temperature of 650° C., and then sequentially forming a contact layer 123 made of p-GaAlInN, a cladding layer 124 made of p-GaAlInN, a light-emitting layer 125 made of GaAlInN, and a cladding layer 126 made of n-GaAlInN on the AlN buffer layer 122. In FIG. 16, reference numerals 127 and 128 denote metal electrodes.

In this semiconductor laser device, the n-GaAlInN layer 126 is formed on the p-GaAlInN 124 layer to prevent mixing of hydrogen into the p-GaAlInN layer 124.

FIG. 17 is a schematic sectional view showing the arrangement of a semiconductor laser according to still another embodiment using a sapphire substrate. An n-GaAlInN buffer layer 132 is formed on a sapphire substrate 131, and an n-GaInAlN cladding layer 133, an undoped GaInAlN light-emitting layer 134, and a p-GaAlInN cladding layer 135 are formed in sequence on the n-GaAlInN buffer layer 132. On the p-GaAlInN cladding layer 135, an n-GaAlInN current blocking layer 136 and a p-GaAlInN contact layer 137 are formed in this order. In FIG. 17, reference numerals 138 and 139 denote metal electrodes.

This semiconductor laser was fabricated in the same manner as in the embodiment shown in FIG. 4 by using the apparatus shown in FIG. 5. When the resultant semiconductor laser was evaluated by x-ray diffraction, it was found that crystal defects were reduced dramatically. Therefore, a high-luminance, short-wavelength light-emitting device can be expected to be realized.

Figure 18:
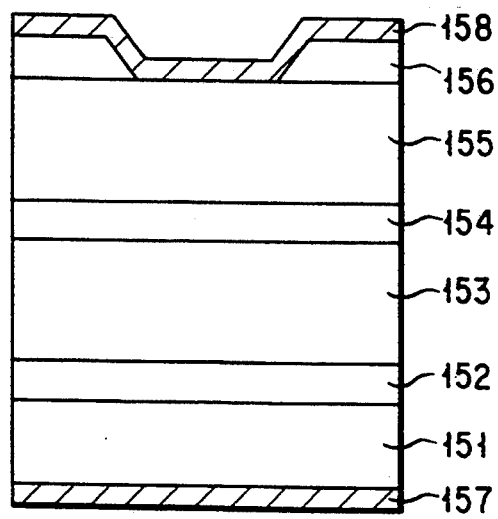
FIG. 18 is a schematic sectional view showing the arrangement of a semiconductor laser device according to still another embodiment of the present invention.

FIG. 18 is a schematic sectional view showing the arrangement of a semiconductor laser according to still another embodiment of the present invention. This semiconductor layer is fabricated by sequentially forming a 1 μm thick GaN buffer layer 152 (undoped), a 2.1 μm thick cladding layer 153 made of p-GaAlInN (Mg-doped, $1\times10^{16}$ to $1\times10^{19}$ cm$^{-3}$, e.g., $1\times10^{17}$ cm$^{-3}$), a 0.1 μm thick light-emitting layer 154 made of undoped GaAlInN, and a 1 μm thick cladding layer 155 made of n-GaAlInN (undoped or Si-doped, $1\times10^{16}$ to $1\times10^{19}$ cm$^{-3}$, e.g., $1\times10^{17}$ cm$^{-3}$) on a 3C-SiC substrate 151. In FIG. 18 reference numeral 156 denotes an SiO$_2$ current blocking layer; and 1567 and 158, metal electrodes.

In this semiconductor laser, since the p-SiC substrate is used, and the p-type electrode is formed on the conductive substrate, a contact resistance and series resistance can be remarkable reduced. As a result, a high brightness, short-wavelength light-emitting device can be realized.

According to the method of the present invention as has been described above, growing a GaAlInN layer on the (111) surface of a cubic SiC substrate dramatically reduces dislocations and strains caused by the difference in thermal expansion coefficient between the substrate and the growing layer. This permits the growth of a low-defect GaAlInN layer, resulting in an improved performance of a semiconductor laser. For example, a high-luminance, short-wavelength light-emitting device can be realized.

Further, crystal growth is carried out by controlling the polarities such that B surface dominant in a group V element, i.e., N surface, opposes to the substrate. Therefore, dislocations and strains can be greatly reduced, and this makes the growth of a low-defect Ga$_x$Al$_{1-x-y}$In$_y$N crystal possible. As a result, since it is possible to grow a cladding layer having a thickness large enough to confine carriers, the performance of a semiconductor device having a pn junction can be improved, and a high-luminance, short-wavelength semiconductor light-emitting device can be realized.

Furthermore, after a p-type layer is grown, an n-type layer is grown to cap this p-type layer so that the p-type layer is not exposed to hydrogen in a cooling process, thereby suppressing mixing of hydrogen into the p-type layer. This increases the degree of activation of the p-type dopant, making the formation of a low-resistance p-type layer possible.

In particular, where a p-type conductive substrate is used, it is possible to remarkable reduce a contact resistance and series resistance consequently, a high-brightness, short-wavelength light-emitting device can be realized.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A compound semiconductor device comprising:
a cubic SiC substrate; and a $Ga_xAl_yIn_{1-x-y}N$ ($0 \leq x \leq 1$, $0 \leq y \leq 1$) layer formed on a (111) surface of said cubic SiC substrate.

2. The compound semiconductor device according to claim 1, wherein a conductivity type of said $Ga_xAl_yIn_{1-x-y}N$ layer is a p-type, and an n-type $Ga_xAl_yIn_{1-x-y}N$ layer is formed on said p-type $Ga_xAl_yIn_{1-x-y}N$ layer.

3. The compound semiconductor device according to claim 1, wherein a conductivity type of said $Ga_xAl_yIn_{1-x-y}N$ layer is a p-type, and a $Ga_xAl_yIn_{1-x-y}N$ layer and an n-type $Ga_xAl_yIn_{1-x-y}N$ layer is formed on said p-type $Ga_xAl_yIn_{1-x-y}N$ layer in turn.

4. The compound semiconductor device according to claim 1, which is a semiconductor laser and wherein a lower cladding layer comprising p-type $Ga_xAl_yIn_{1-x-y}N$, a light-emitting layer comprising $Ga_xAl_yIn_{1-x-y}N$, and an upper cladding layer comprising n-type $Ga_xAl_yIn_{1-x-y}N$ are formed on said substrate in turn.

5. The compound semiconductor device according to claim 1, which is a semiconductor laser and wherein a lower cladding layer comprising n-type $Ga_xAl_yIn_{1-x-y}N$, a light-emitting layer comprising $Ga_xAl_yIn_{1-x-y}N$, an upper cladding layer comprising p-type $Ga_xAl_yIn_{1-x-y}N$, and a current blocking layer comprising n-type $Ga_xAl_yIn_{1-x-y}N$ are formed on said substrate in turn.

6. The compound semiconductor device according to claim 1, which is a semiconductor laser and wherein a buffer layer comprising $Ga_xAl_yIn_{1-x-y}N$, a lower cladding layer comprising p-type $Ga_xAl_yIn_{1-x-y}N$, a light-emitting layer comprising $Ga_xAl_yIn_{1-x-y}N$, and an upper cladding layer comprising n-type $Ga_xAl_yIn_{1-x-y}N$ are formed on said substrate in turn.

7. A compound semiconductor device having a pn junction, comprising:
a substrate; and
a $Ga_xAl_yIn_{1-x-y}N$ ($0 \leq x \leq 1$, $0 \leq y \leq 1$) layer formed on said substrate,
wherein a crystal face of said $Ga_xAl_yIn_{1-x-y}N$ layer opposing said substrate is an N surface.

8. The compound semiconductor device according to claim 7, wherein said substrate comprises SiC.

9. The compound semiconductor device according to claim 8, wherein a surface of said substrate on which said $Ga_xAl_yIn_{1-x-y}N$ layer is formed, is an Si surface.

10. The compound semiconductor device according to claim 7, wherein a conductivity type of said $Ga_xAl_yIn_{1-x-y}N$ layer is a p-type, and an n-type $Ga_xAl_yIn_{1-x-y}N$ layer is formed on said p-type $Ga_xAl_yIn_{1-x-y}N$ layer.

11. The compound semiconductor device according to claim 7, wherein a conductivity type of said $Ga_xAl_yIn_{1-x-y}N$ layer is a p-type, and a $Ga_xAl_yIn_{1-x-y}N$ layer and an n-type $Ga_xAl_yIn_{1-x-y}N$ layer is formed on said p-type $Ga_xAl_yIn_{1-x-y}N$ layer in turn.

12. The compound semiconductor device according to claim 7, which is a semiconductor laser and wherein a lower cladding layer comprising p-type $Ga_xAl_yIn_{1-x-y}N$, a light-emitting layer comprising $Ga_xAl_yIn_{1-x-y}N$, and an upper cladding layer comprising n-type $Ga_xAl_yIn_{1-x-y}N$ are formed on said substrate in turn.

13. The compound semiconductor device according to claim 7, which is a semiconductor laser and wherein a lower cladding layer comprising n-type $Ga_xAl_yIn_{1-x-y}N$, a light-emitting layer comprising $Ga_xAl_yIn_{1-x-y}N$, an upper cladding layer comprising p-type $Ga_xAl_yIn_{1-x-y}N$, and current blocking layer comprising n-type $Ga_xAl_yIn_{1-x-y}N$ are formed on said substrate in turn.

14. The compound semiconductor device according to claim 7, wherein said substrate comprises a sapphire, and a buffer layer comprising $Ga_xAl_yIn_{1-x-y}N$ is formed on said substrate.

15. The compound semiconductor device according to claim 14, which is a semiconductor laser and wherein a buffer layer comprising $Ga_xAl_yIn_{1-x-y}N$, a lower cladding layer comprising p-type $Ga_xAl_yIn_{1-x-y}N$, a light-emitting layer comprising $Ga_xAl_yIn_{1-x-y}N$, and an upper cladding layer comprising n-type $Ga_xAl_yIn_{1-x-y}N$ are formed on said substrate in turn.

16. A compound semiconductor device comprising:
a p-type conductive substrate;
a p-type $Ga_xAl_yIn_{1-x-y}N$ ($0 \leq x \leq 1$, $0 \leq y \leq 1$) layer formed on said substrate, and
an n-type $Ga_xAl_yIn_{1-x-y}N$ ($0 \leq x \leq 1$, $0 \leq y \leq 1$) layer formed on said p-type $Ga_xAl_yIn_{1-x-y}N$ layer.

17. The compound semiconductor device according to claim 16, wherein said p-type conductive substrate comprises a p-type SiC.

18. The compound semiconductor device according to claim 16, which is a semiconductor laser and wherein a lower cladding layer comprising p-type $Ga_xAl_yIn_{1-x-y}N$, a light-emitting layer comprising $Ga_xAl_yIn_{1-x-y}N$, and an upper cladding layer comprising n-type $Ga_xAl_yIn_{1-x-y}N$ are formed on said p-type conductive substrate in turn.

19. The compound semiconductor device according to claim 16, which is a semiconductor laser and wherein a buffer layer comprising $Ga_xAl_yIn_{1-x-y}N$, a lower cladding layer comprising p-type $Ga_xAl_yIn_{1-x-y}N$, a light-emitting layer comprising $Ga_xAl_yIn_{1-x-y}N$, and an upper cladding layer comprising n-type $Ga_xAl_yIn_{1-x-y}N$ are formed on said p-type conductive substrate in turn.

20. The compound semiconductor device according to claim 16, wherein a pair of electrodes are formed on a surface of said p-type conductive substrate on opposite side from said p-type $Ga_xAl_yIn_{1-x-y}N$ layer, and on said n-type $Ga_xAl_yIn_{1-x-y}N$ layer, respectively.

* * * * *